(12) United States Patent
Liu et al.

(10) Patent No.: US 11,830,728 B2
(45) Date of Patent: Nov. 28, 2023

(54) METHODS FOR SEAMLESS GAP FILLING OF DIELECTRIC MATERIAL

(71) Applicant: Applied Materials, Inc., Santa Clara, CA (US)

(72) Inventors: Chengyu Liu, San Jose, CA (US); Ruitong Xiong, San Jose, CA (US); Bo Xie, San Jose, CA (US); Xianmin Tang, San Jose, CA (US); Yijun Liu, Santa Clara, CA (US); Li-Qun Xia, Cupertino, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 101 days.

(21) Appl. No.: 17/499,955

(22) Filed: Oct. 13, 2021

(65) Prior Publication Data
US 2023/0113965 A1    Apr. 13, 2023

(51) Int. Cl.
    *H01L 21/02*      (2006.01)
    *H01L 21/3205*    (2006.01)
    *H01L 21/762*     (2006.01)

(52) U.S. Cl.
    CPC .. *H01L 21/02244* (2013.01); *H01L 21/02247* (2013.01); *H01L 21/02252* (2013.01); *H01L 21/02255* (2013.01); *H01L 21/32051* (2013.01); *H01L 21/76227* (2013.01)

(58) Field of Classification Search
    CPC ...................................... H01L 21/76224–76237
    See application file for complete search history.

(56) References Cited

U.S. PATENT DOCUMENTS

| | | | |
|---|---|---|---|
| 4,323,589 A * | 4/1982 | Ray | H01L 21/02164 427/539 |
| 5,039,598 A | 8/1991 | Abramsohn et al. | |
| 6,616,773 B1 * | 9/2003 | Kuzumoto | G03F 7/422 134/2 |
| 7,365,005 B1 | 4/2008 | Gadgil | |
| 7,964,504 B1 * | 6/2011 | Shaviv | H01L 21/76879 257/E21.17 |

(Continued)

FOREIGN PATENT DOCUMENTS

WO    WO 2013/148444 A1    10/2013

OTHER PUBLICATIONS

International Search Report for PCT/US2022/036083, dated Nov. 3, 2022.

*Primary Examiner* — Erik Kielin
(74) *Attorney, Agent, or Firm* — FIRM: MOSER TABOADA

(57) ABSTRACT

A method for dielectric filling of a feature on a substrate yields a seamless dielectric fill with high-k for narrow features. In some embodiments, the method may include depositing a metal material into the feature to fill the feature from a bottom of the feature wherein the feature has an opening ranging from less than 20 nm to approximately 150 nm at an upper surface of the substrate and wherein depositing the metal material is performed using a high ionization physical vapor deposition (PVD) process to form a seamless metal gap fill and treating the seamless metal gap fill by oxidizing/nitridizing the metal material of the seamless metal gap fill with an oxidation/nitridation process to form dielectric material wherein the seamless metal gap fill is converted into a seamless dielectric gap fill with high-k dielectric material.

20 Claims, 7 Drawing Sheets

(56) References Cited

U.S. PATENT DOCUMENTS

| | | |
|---|---|---|
| 9,230,815 B2 | 1/2016 | Fu et al. |
| 9,847,222 B2 | 12/2017 | Reilly et al. |
| 2006/0019033 A1 | 1/2006 | Muthukrishnan et al. |
| 2009/0191721 A1 | 7/2009 | Cerio, Jr. et al. |
| 2014/0127912 A1 | 5/2014 | Wu et al. |
| 2017/0278686 A1 | 9/2017 | Brcka |
| 2018/0005758 A1 | 1/2018 | Felten et al. |
| 2018/0240706 A1* | 8/2018 | Mallick ............. H01L 21/76879 |
| 2018/0358260 A1* | 12/2018 | Roy ................... H01L 21/76801 |
| 2019/0185983 A1* | 6/2019 | Mullick ............ H01L 21/31051 |
| 2019/0316249 A1 | 10/2019 | Abraham et al. |
| 2019/0355620 A1* | 11/2019 | Freed ................ H01L 21/76819 |
| 2019/0385907 A1 | 12/2019 | Gottheim et al. |
| 2021/0143051 A1 | 5/2021 | Hattendorf et al. |

* cited by examiner

METHODS FOR SEAMLESS GAP FILLING OF DIELECTRIC MATERIAL

FIELD

Embodiments of the present principles generally relate to semiconductor processing of semiconductor substrates.

BACKGROUND

Various dielectric materials are used in semiconductor features to facilitate in electrically isolating structures. Typically, the dielectric materials are deposited by chemical vapor deposition or atomic layer deposition in a conformal manner. The conformal layers, however, have limitations as the size of the features shrinks. The inventors have found that in small features or certain special structures with inner bowing shape, the conformal layers will form on the sidewalls of the feature and grow together to leave a seam inside of the feature. The seam is problematic as the seam inhibits the isolating performance of the feature.

Accordingly, the inventors have provided improved processes that provide a seamless dielectric material fill for narrow features on a substrate.

SUMMARY

Methods for providing seamless dielectric gap filling of features on a substrate are provided herein.

In some embodiments, a method for dielectric filling of a feature on a substrate may comprise depositing a metal material into the feature and direct filling of the feature starting from a bottom of the feature, wherein the feature has an opening ranging from less than 20 nm to approximately 150 nm at an upper surface of the substrate and wherein depositing the metal material is performed using a high metal ionization physical vapor deposition (PVD) process in a very high frequency RF based PVD chamber or a high ionization DC based PVD chamber to form a seamless metal gap fill and treating the seamless metal gap fill by oxidizing the metal material of the seamless metal gap fill with an oxidation process or by nitridizing the metal material with a nitridation process to form dielectric material, wherein the seamless metal gap fill is converted into a seamless dielectric gap fill with high-k dielectric material.

In some embodiments, the method may further include performing the oxidizing process at a temperature of approximately room temperature to approximately 500 degrees Celsius, depositing the metal material at a pressure of approximately 50 mTorr to approximately 500 mTorr with the very high frequency RF based PVD chamber or at a pressure of approximately less than 5 mT with the high ionization DC based PVD chamber, depositing the metal material with the very high frequency RF based PVD chamber using an RF power frequency of approximately 40 MHz with an RF power of approximately 1000 watts to approximately 7000 watts or depositing the metal material with high ionization DC based PVD chamber using a source DC power of approximately 15 kW to approximately 60 kW with an RF bias power of approximately 75 watts to approximately 1500 watts, wherein the metal material is hafnium, aluminum, tantalum, or zirconium, wherein the oxidizing process is a thermal oxidation process or a plasma-assisted oxidation process, wherein the thermal oxidation process is an ultraviolet (UV) plus ozone-based process or a UV plus oxygen-based process, performing the UV plus ozone-based process for approximately 200 seconds to approximately 300 seconds, performing the UV plus ozone-based process for approximately 240 seconds at a temperature of 485 degrees Celsius, wherein the plasma-assisted oxidation process is an inductively coupled plasma (ICP) or a capacitively coupled plasma (CCP) oxygen plasma discharge-based oxidation process with different process temperatures for ICP-based or CCP-based processes, performing the plasma-assisted oxidation process at a pressure of approximately 1 mTorr to approximately 30 mTorr and a power range from approximately 50 W to approximately 1000 W, treating the seamless metal gap fill for approximately 200 seconds to approximately 300 seconds for a single cycle treatment at a first temperature and approximately 10 seconds to approximately 100 seconds for each cycle of a multi-cycle treatment at a second temperature lower than the first temperature, and/or repeating the method for at least two cycles until the feature is filled from the bottom to approximately the upper surface of the substrate or beyond.

In some embodiments, a method for dielectric filling of a feature on a substrate may comprise depositing a metal material into the feature and direct filling of the feature starting from a bottom of the feature, wherein the feature has an opening ranging from less than 20 nm to approximately 150 nm at an upper surface of the substrate and wherein depositing the metal material is performed using a high metal ionization physical vapor deposition (PVD) process in a very high frequency RF based PVD chamber using an RF power frequency of approximately 40 MHz with an RF power of approximately 1000 watts to approximately 7000 watts at a pressure of approximately to approximately 500 mTorr or a high ionization DC based PVD chamber to form a seamless metal gap fill using a source DC power of approximately 15 kW to approximately 60 kW with an RF bias power of approximately 75 watts to approximately 1500 watts at a pressure of approximately less than 5 mTorr and treating the seamless metal gap fill by oxidizing the metal material of the seamless metal gap fill with an oxidation process or by nitridizing the metal material with a nitridation process to form dielectric material, wherein the seamless metal gap fill is converted into a seamless dielectric gap fill with high-k dielectric material.

In some embodiments, the method may further include wherein the oxidizing process is a thermal oxidation process or a plasma-assisted oxidation process, wherein the thermal oxidation process is an ultraviolet (UV) plus ozone-based process or a UV plus oxygen-based process, performing the UV plus ozone-based process for approximately 200 seconds to approximately 300 seconds, performing the UV plus ozone-based process for approximately 240 seconds at a temperature of 485 degrees Celsius, and/or performing the plasma-assisted oxidation process at a pressure of approximately 1 mTorr to approximately 30 mTorr and a power range of approximately to approximately 1000 W.

In some embodiments, a non-transitory, computer readable medium having instructions stored thereon that, when executed, cause a method for dielectric filling of a feature on a substrate to be performed, the method may comprise depositing a metal material into the feature and direct filling of the feature starting from a bottom of the feature, wherein the feature has an opening of less than 20 nm to approximately 150 nm at an upper surface of the substrate and wherein depositing the metal material is performed using a high metal ionization physical vapor deposition (PVD) process in a very high frequency RF based PVD chamber or a high ionization DC based PVD chamber to form a seamless metal gap fill and treating the seamless metal gap fill by oxidizing the metal material of the seamless metal gap fill with an oxidizing process to form dielectric material, wherein the seamless metal gap fill is converted into a seamless dielectric gap fill with high-k dielectric material.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
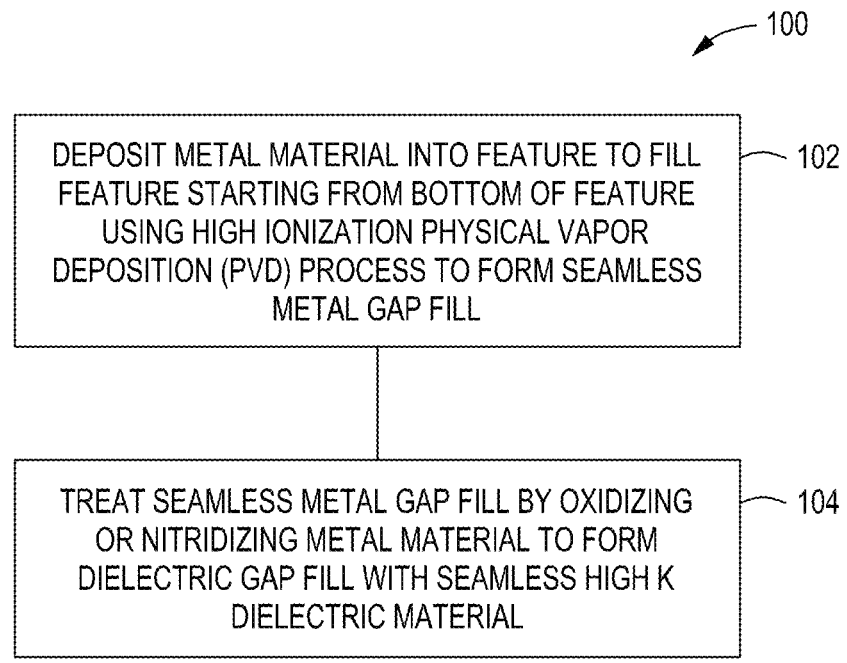
FIG. 1 is a method for dielectric filling of a feature on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods presented herein provide seamless high-k dielectric gap fill for narrow features. A seamless metal material bottom-up fill is accomplished using a highly ionized physical vapor deposition (PVD) technique in structures with openings ranging from less than 20 nm to 150 nm. A post-deposition conversion from metal to dielectric of the gap fill is performed using an additional film treatment (a thermal process or a plasma-assisted process). The seamless dielectric gap fill can be achieved by a single cycle (deposition/treatment) process or by a multi-cycle deposition/treatment process with a wide gap fill window. The seamless dielectric gap fill can potentially be achieved within a single chamber performing both deposition and treatment processes.

In advanced covalent organometallic nanosheet (COMS) structures such as nanosheet architectures, a seamless high-k dielectric layer in narrow gaps is needed to form a good isolation layer. Traditional processes using atomic layer deposition (ALD) or chemical vapor deposition (CVD) to create conformal layers always leave a seam between the conformal layers in a feature. Even more problematic, if the feature has some bowing inside, voids can form at the seam, further decreasing performance of the feature. In the present methods, a direct metal bottom-up fill is combined with a film oxidation or nitridation treatment for seamless dielectric fill in a narrow feature. The bottom-up metal fill process is achieved in a high metal ionization chamber with good metal directionality. The oxidation or nitridation treatment process may be done by thermal oxidation or with a plasma-assisted oxidation or nitridation method. The methods herein may also be accomplished using multiple cycles, instead of a single cycle, at lower temperatures when thermal budgets are a concern.

Figure 2:
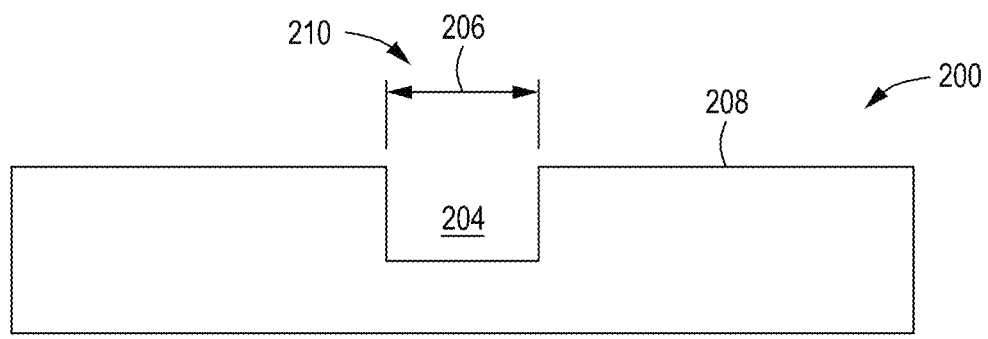
FIG. 2 depicts a cross-sectional view of a feature on a substrate in accordance with some embodiments of the present principles.
Figure 3:
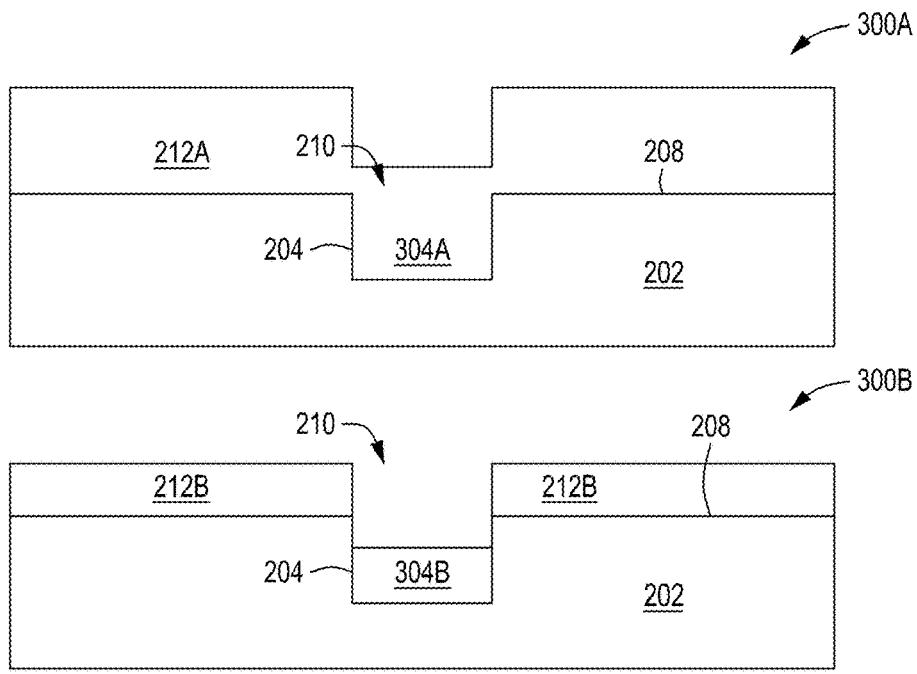
FIG. 3 depicts a cross-sectional view of a feature on a substrate after partial or full gap filling process in accordance with some embodiments of the present principles.
Figure 4:
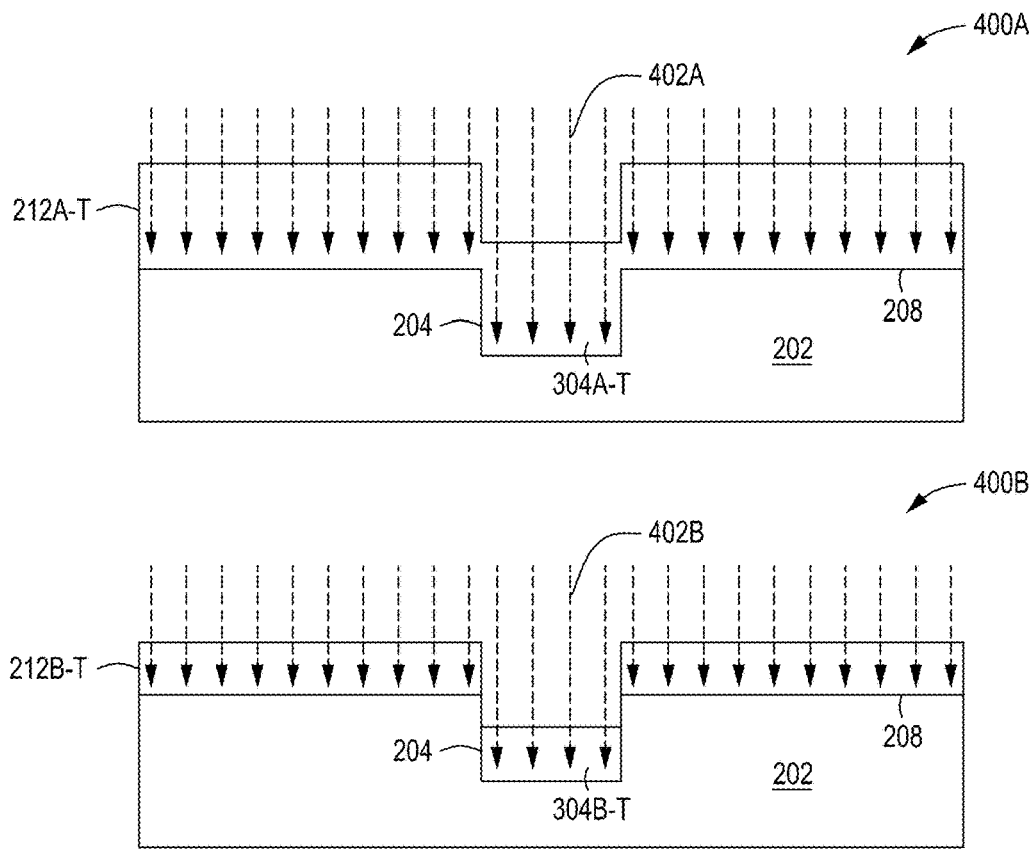
FIG. 4 depicts a cross-sectional view of a feature on a substrate undergoing an oxidation or a nitridation treatment process in accordance with some embodiments of the present principles.
Figure 5:
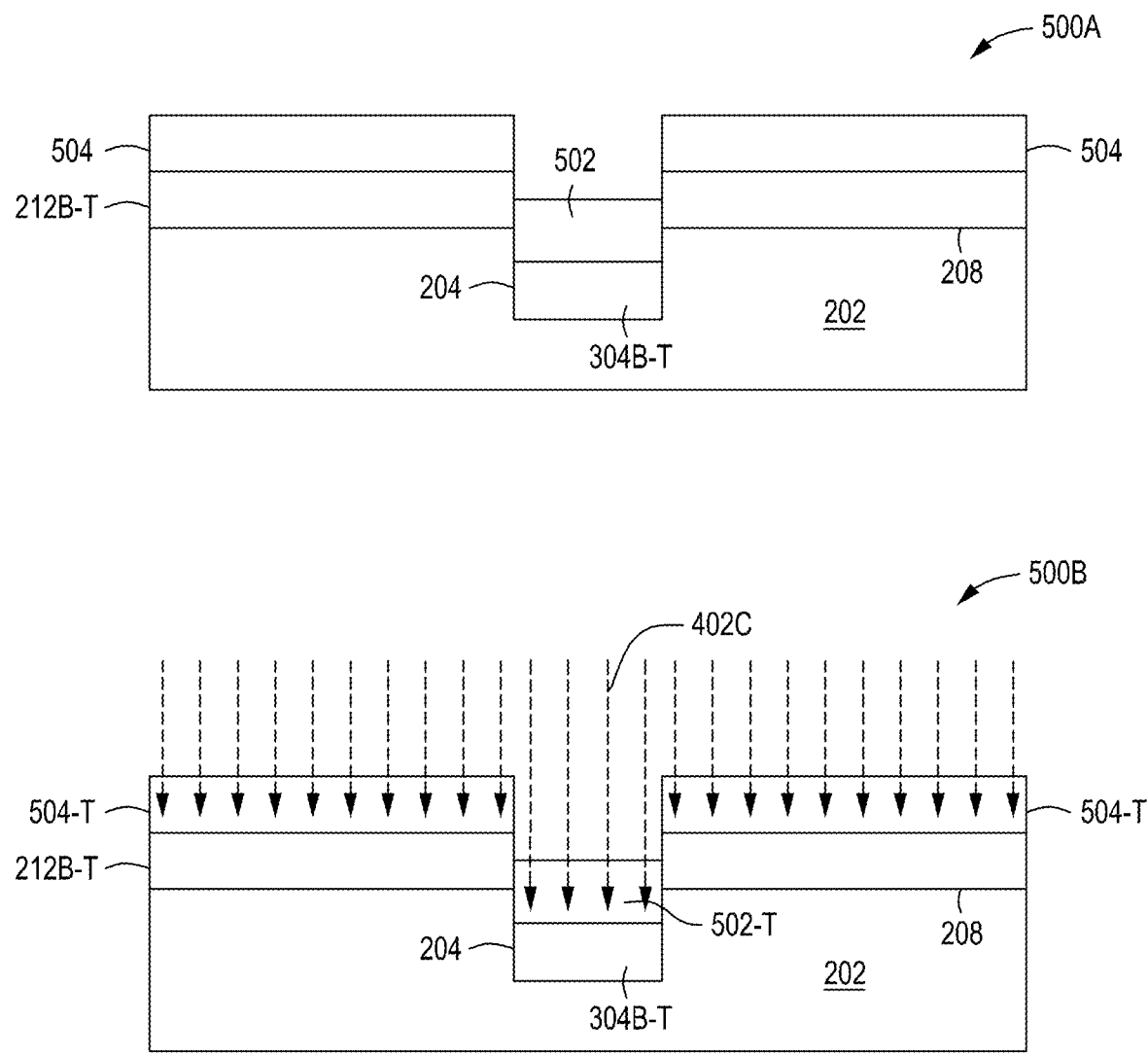
FIG. 5 depicts a cross-sectional view of a feature on a substrate undergoing a multi-cycle deposition and an oxidation or a nitridation treatment process in accordance with some embodiments of the present principles.

FIG. 1 is a method 100 for dielectric filling of a feature on a substrate in accordance with some embodiments. References to FIGS. 2-8 may be made to assist in describing the method 100. In block 102, metal material is deposited into a feature by filling the feature starting from the bottom using a high metal ionization physical vapor deposition (PVD) process to form a seamless metal gap fill in the feature. In some embodiments the feature may be, but not limited to, a via and/or a trench and the like. In some embodiments, the feature 204 has an opening 210 at an upper surface 208 of the substrate 202 with a width 206 ranging from less than 20 nm to approximately 150 nm as depicted in a view 200 of FIG. 2. In some embodiments for a single cycle process, a full seamless metal gap fill 304A fills the feature 204 by depositing a thicker fill layer 212A to at least the upper surface 208 of the substrate 202 if not beyond as depicted in a view 300A of FIG. 3. In some embodiments for a multiple cycle process, a partial seamless metal gap fill 304B only partially fills the feature 204 by depositing a first thinner fill layer 212B to a level below the upper surface 208 of the substrate 202 as depicted in a view 300B of FIG. 3. In some embodiments, the metal material is deposited at a process pressure of approximately 50 mTorr to approximately 500 mTorr. In some embodiments, the PVD process uses an RF frequency of approximately at a power level of approximately 1000 watts to approximately 7000 watts during deposition of the metal material. The metal material may be hafnium, zirconium, aluminum, tantalum, and the like. The high ionization metal deposition process can also be achieved with a high DC power-based and a long throw chamber.

The high ionization used for the metal material filling of the feature enables complete and void free filling of the feature. To accomplish high ionization, a very high frequency (VHF) chamber is used at a frequency of, for example but not limited to, approximately 40 MHz and the like for the RF power source used to generate the plasma in the chamber. High pressure is used as well to assist in producing high metal ionization in the chamber during deposition. In some embodiments, an auto capacitance tuner (ACT) (described further below for FIG. 6) is used to tune the ion energy as well. The ACT tunes the ion energy at the wafer level to drive the ions to the bottom of the features in order to deposit the metal material from the bottom up. The high metal ionization can also be achieved with a DC-based PVD source with very high-power density and long throw, sometimes with additional collimation methods such as a flux optimizer, etc.

In block 104, the seamless metal gap fill is treated by oxidizing or nitridizing the metal material of the seamless metal gap fill with an oxidation process or a nitridation process to form a dielectric gap fill with a seamless high-k dielectric material. For the sake of brevity, examples of some embodiments may be given using oxidation processes but are not meant to be limiting as nitridation processes may be used as well to convert the metal material to a seamless dielectric material. In some embodiments for a single cycle process, the full seamless metal gap fill 304A is treated 402A by a thermal process or a plasma-assisted process to convert the metal material of the full seamless metal gap fill 304A into a seamless dielectric gap fill of treated full seamless metal gap fill 304A-T from top to bottom as depicted in a view 400A of FIG. 4. The thicker fill layer 212A is also converted into a treated thicker fill layer 212A-T. In some embodiments for a multiple cycle process, the partial seamless metal gap fill 304B is treated 402B by a thermal process or a plasma-assisted process to convert the metal material of the partial seamless metal gap fill 304B into a seamless dielectric gap fill throughout the partial fill into a treated partial seamless metal gap fill 304B-T as depicted in a view 400B of FIG. 4. The thinner fill layer 212B is also converted into a treated thinner fill layer 212B-T. For multiple cycle processes, the high ionization metal fill process is repeated one or more times to add additional fill 502 by depositing a second thinner fill layer 504 on the substrate 202 as depicted in a view 500A of FIG. 5. After each fill process, the metal fill is treated 402C with an oxidation/nitridation process to convert the metal material into a seamless dielectric gap fill throughout the additional fill 502 to form treated additional fill 502-T as depicted in a view 500B of FIG. 5. The second thinner fill layer 504 is also converted into a treated second thinner fill layer 504-T.

The conversion process of the metal material into a metal oxide material can be achieved through a thermal oxidation process or a plasma assisted oxidation process. In a thermal oxidation process, the process is dependent upon the temperature of the conversion process and also the duration of the process. Higher temperatures along with greater durations allow for greater penetration into the metal materials. High temperatures, in some UV-based thermal oxidation processes, may result in undesired side effects such as shrinking or densifying of surface material, underlying materials, or adjacent materials on the substrate. If the surface material of the metal material is densified during the treatment process, penetration to the bottom of the metal material becomes difficult. In such cases, longer durations may be used at lower temperatures to ensure that the metal material has been fully converted to metal oxide without the undesired side effects. In some thermal oxidation treatments using UV plus oxygen, the penetration depth is generally very shallow. Using a multiple cycle process allows the UV plus oxygen process to become viable for converting metal material into metal oxide material.

In some embodiments, the oxidizing process is performed at a temperature of approximately 200 degrees Celsius to approximately 500 degrees Celsius. In some embodiments, the oxidizing process is performed at a temperature of approximately 485 degrees Celsius for single cycle processes. Higher temperatures are used to ensure that the oxygen penetrates throughout the single fill material. In some embodiments, the oxidizing process is performed at a temperature of approximately 385 degrees for multiple cycle processes. Because less metal material is to be converted than for a full fill metal fill, lower temperatures can be used to oxidize the smaller amount of metal fill. The lower temperatures are beneficial for low thermal budget scenarios. In some embodiments, the thermal oxidation process may use UV plus ozone or UV plus oxygen to convert the metal material into high-k dielectric material in the feature. Oxygen has the benefit of being benign and much cheaper to produce and use than ozone-based processes. Ozone has the benefit of having greater penetration.

In some embodiments using a single cycle, the oxidizing treatment has a duration of approximately 200 seconds to approximately 300 seconds. In some embodiments for a single cycle, the oxidizing treatment has a duration of approximately 240 seconds. In some embodiments using a single cycle, the oxidizing treatment has a duration of approximately 240 seconds at a temperature of 485 degrees. The duration may be adjusted based on whether the metal material is a partial fill or a full fill of the feature. In some embodiments for multiple cycles, the oxidizing treatment has a duration of approximately 10 seconds to approximately 100 seconds.

In a plasma-assisted oxidation process, the treatment effect depends on the process temperature, the source power, the bias power, and the pressure. The temperature can be set between room temperature (approximately 20 degrees Celsius) to approximately 450 degrees Celsius. The oxidation process can use a source power between approximately 50 W to approximately 1000 W, a bias power from 0W to approximately 300 W, a pressure ranging from approximately 1 mT to approximately 30 mT. In some embodiments for plasma-assisted treatments, the duration of the process is greater than zero to less than approximately 100 seconds. So, thermal oxidation processes generally have greater durations than plasma-assisted treatments. Also, plasma-assisted oxidation processes have low penetration power and are generally suited for multiple cycle processes. So, a plasma-assisted treatment process is preferred if thermal budget is a concern due to the integration flow requirement.

Figure 6A:
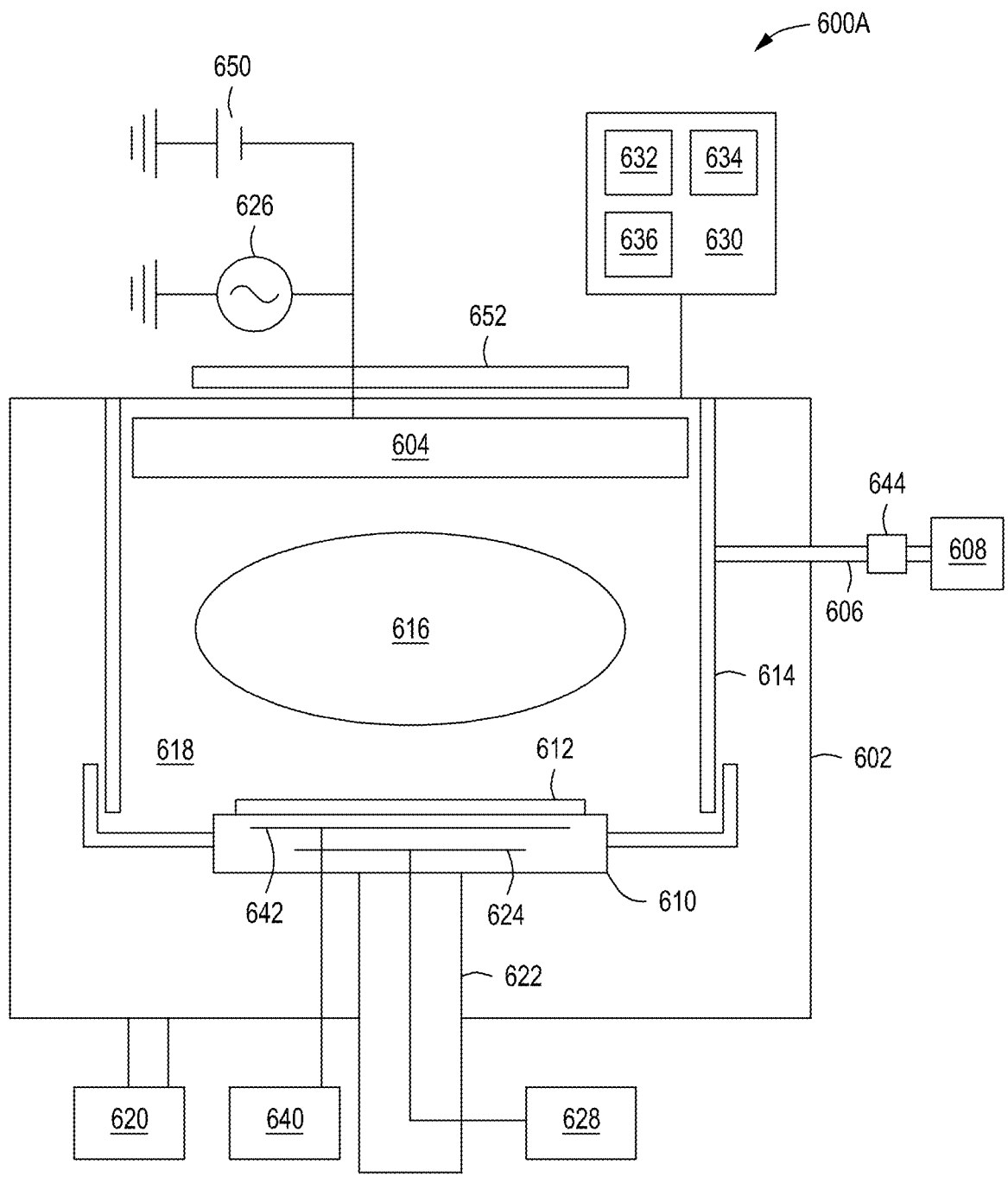
FIG. 6A depicts an RF-based high ionization physical vapor deposition chamber in accordance with some embodiments of the present principles.

FIG. 6A depicts a view 600A of a process chamber 602 used for RF-based physical vapor deposition (PVD) in accordance with some embodiments. The process chamber 602 may be used as a high metal ionization deposition chamber to deposit seamless metal gap fill material into a feature as described above. The process chamber 602 includes a substrate support 622 that holds an electrostatic chuck (ESC) 610 and a shield 614 that surrounds a processing volume 618. A process gas or gases may be provided into the processing volume 618 via a supply conduit 606 from a gas supply 608. The process gas flow rate is controlled by a gas flow valve 644. The plasma-forming gas may include one or more inert gases, such as a noble gas, or other inert gases. For example, non-limiting examples of suitable plasma forming gases include one or more of argon (Ar), helium (He), xenon (Xe), neon (Ne), hydrogen ($H_2$), nitrogen ($N_2$), oxygen ($O_2$), or the like.

The process chamber 602 is a capacitively coupled plasma chamber that forms plasma 616 in the processing volume 618 to process a substrate 612 on the ESC 610. The process chamber 602 may also include a source magnetron 652. The plasma reactions produce a high ionization to increase ion fraction to enable better bottom-up gap filing of features. An auto capacitance tuner (ACT) 628 also assists in the bottom-up filling by adjusting the impedances of a substrate support impedance circuit of the process chamber 602 to modulate ion energy and directionality. The auto capacitance tuner 628 adjusts the capacitance (and thus impedance) from the substrate support electrode 624 to ground in order to control the sheath voltage at the substrate 612. The auto capacitance tuner 628 is tuned to maintain the amount of RF current at the substrate support at a predetermined set point value or within a predetermined range of a predetermined set point value. In some embodiments, tuning the auto capacitance tuner 628 comprises calculating the predetermined set point value and calculating the predetermined set point position. The predetermined set point position may be determined empirically or by modeling as the auto capacitance tuner 628 position with the optimized wafer floating voltage.

In some embodiments, an RF plasma power source 626 provides a 40 MHz frequency to the process chamber 602 at a power level of approximately 1000 watts to approximately 7000 watts. In some embodiments, a DC power source 650 may also be used. The plasma 616 interacts with a target 604 to sputter the target material onto the substrate 612. The target 604 and the sputtered material deposited on the substrate 612 may be, for example but not limited to, hafnium, zirconium, aluminum, tantalum, and the like. The pump 620 is used to maintain the process pressure within the process chamber 602. In some embodiments, the process pressure may be from approximately 50 mTorr to approximately 500 mTorr. The process chamber 602 may also have cooling and/or heating elements or channels 642 that allow temperature control of the substrate 612 during processing by a temperature controller 640.

A controller 630 controls the operation of the process chamber 602 using a direct control of the process chamber 602 or alternatively, by controlling the computers (or controllers) associated with the process chamber 602. In operation, the controller 630 enables data collection and feedback from the respective systems to optimize performance of the process chamber 602. The controller 630 generally includes a Central Processing Unit (CPU) 632, a memory 634, and a support circuit 636. The CPU 632 may be any form of a general-purpose computer processor that can be used in an industrial setting. The support circuit 636 is conventionally coupled to the CPU 632 and may comprise a cache, clock circuits, input/output subsystems, power supplies, and the like. Software routines, such as a method as described herein may be stored in the memory 634 and, when executed by the CPU 632, transform the CPU 632 into a specific purpose computer (controller 630). The software routines may also be stored and/or executed by a second controller (not shown) that is located remotely from the process chamber 602.

The memory 634 is in the form of computer-readable storage media that contains instructions, when executed by the CPU 632, to facilitate the operation of the semiconductor processes and equipment. The instructions in the memory 634 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 6B:
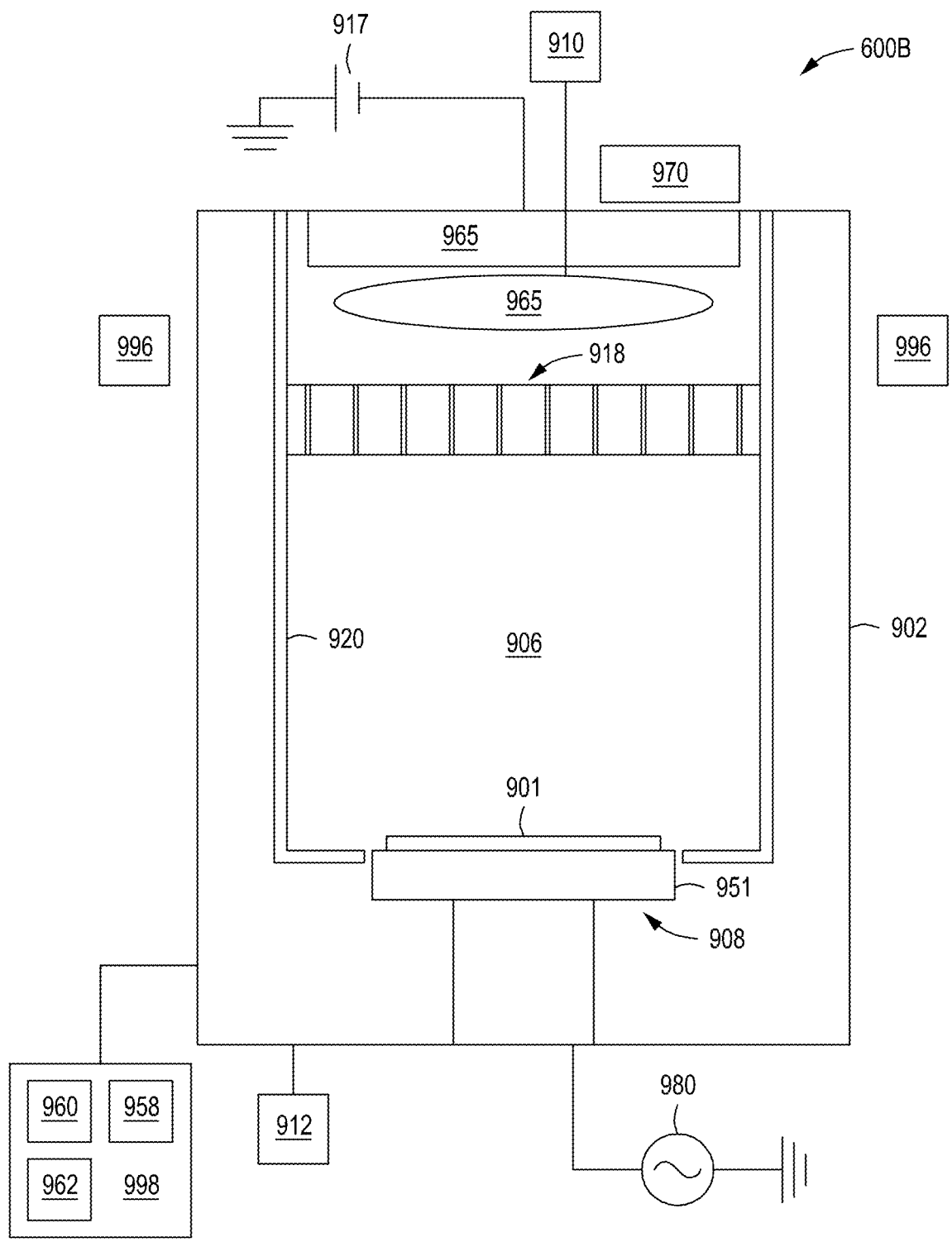
FIG. 6B depicts a DC-based long-throw high ionization physical vapor deposition chamber in accordance with some embodiments of the present principles.

FIG. 6B depicts a view 600B of a process chamber 902 such as a DC-based long throw high ionization physical vapor deposition (PVD) chamber in accordance with some embodiments. In some embodiments, the process chamber 902 further includes a collimator 918 or flux optimizer, disposed in an interior volume 906. A substrate support 908 is disposed in the interior volume 906 of the process chamber 900. The substrate support 908 may include, for example, an electrostatic chuck (ESC) 951. A gas source 910 is coupled to the process chamber 902 to supply process gases into the interior volume 906. In some embodiments, process gases may include inert gases, non-reactive gases, and reactive gases, if necessary. A pumping device 912 is coupled to the process chamber 902 in communication with the interior volume 906 to control the pressure of the interior volume 906. In some embodiments, during deposition the pressure level of the process chamber 902 may be maintained at less than 5 mTorr.

The target 914 is fabricated from a material to be deposited on the substrate. The target 914 may be coupled to a source assembly comprising a power supply 917 for the target 914. In some embodiments, the power supply 917 may be a DC power supply. A high-density magnetron 970 is positioned above the target 914. The high-density magnetron 970 may include a plurality of magnets supported by a base plate connected to a shaft, which may be axially aligned with the central axis of the process chamber 902 and the substrate 901. The high-density magnetron 970 produces a magnetic field within the process chamber 902 near the front face of the target 914 to generate plasma 965 so a significant flux of ions strike the target 914, causing sputter emission of target material. Magnets of the high-density magnetron 970 may be rotated about a central shaft to increase uniformity of the magnetic field across the surface of the target 914. The process chamber 902 further includes a shield 920. The collimator 918 may be positioned in the interior volume 906 between the target 914 and the substrate support 908. In some embodiments, the collimator 918 may be electrically biased to control ion flux to the substrate and neutral angular distribution at the substrate, as well as to increase the deposition rate due to an additional DC bias. Electrically biasing the collimator results in reduced ion loss to the collimator, advantageously providing greater ion/neutral ratios at the substrate. A collimator power source (not shown) is coupled to the collimator 918 to facilitate biasing of the collimator 918. In some embodiments, the collimator 918 may be electrically isolated from grounded chamber components.

In some embodiments, a set of magnets 996 may be disposed adjacent to the process chamber 902 to assist with generating the magnetic field to guide dislodged ions from the target 914. The magnetic field formed by the set of magnets 996 may alternatively or in combination prevent ions from hitting the sidewalls of the chamber (or sidewalls of the shield 920) and direct the ions vertically through the collimator 918. For example, the set of magnets 996 are configured to form a magnetic field having substantially vertical magnetic field lines in the peripheral portion. The substantially vertical magnetic field lines advantageously guide ions through the interior volume. The set of magnets 996 may include any combination of electromagnets and/or permanent magnets necessary to guide the metallic ions along a desired trajectory from the target, through the collimator 918, and toward the center of the substrate support 908. The set of magnets 996 may be stationary or moveable to adjust the position of a set of magnets in a direction parallel to a central axis of the chamber. Currents through electromagnets may be adjusted to subsequently adjust the magnetic fields. An RF power source 980 may be coupled to the process chamber 902 through the substrate support 908 to provide a bias power between the target 914 and the substrate support 908. In some embodiments, the RF power source 980 may have a frequency between approximately 400 Hz and approximately 200 MHz, such as approximately 13.56 MHz. In some embodiments, the RF power source 980 may provide greater than zero watts to approximately 1000 watts of bias power.

To ensure that the trajectory of the sputtered metallic ions has enough space to be changed, the collimator 918 is disposed at a predetermined height above the substrate support 908. In some embodiments, the height is between approximately 400 mm to approximately 800 mm, for example, approximately 600 mm. The height is also chosen to facilitate control of ions using the magnetic field beneath the collimator 918 to further improve deposition characteristics on the substrate 901. To enable modulation of the magnetic field above the collimator 918, the collimator 918 may be disposed at a predetermined height beneath the target 914. The height may be between approximately 25 mm to approximately 75 mm, for example, approximately 50 mm. The overall target to substrate spacing (or target to support surface spacing), is approximately 600 mm to approximately 800 mm.

During processing, material is sputtered from the target 914 and deposited on the surface of the substrate 901. The target 914 and the substrate support 908 are biased relative to each other by the power supply 917 or the RF power source 980 to maintain a plasma formed from the process gases supplied by the gas source 910. In some embodiments, the process temperature may range from room temperature (approximately 20 degrees Celsius) to approximately 400 degrees Celsius. In some embodiments, the process pressure may be less than approximately 5 mTorr. In some embodiments, the DC power may be from approximately 15 kW to approximately 60 kW and the RF bias power may be from approximately 75 W to approximately 1.5 kW. In some embodiments, a DC pulsed bias power applied to the collimator 918 also assists controlling ratio of the ions and neutrals passing through the collimator 918, advantageously enhancing the trench sidewall and bottom fill-up capability. The ions from the plasma are accelerated toward and strike the target 914, causing target material to be dislodged from the target 914. The dislodged target material and process gases forms a layer on the substrate 901 with desired compositions.

A controller 998 controls the operation of the process chamber 902 using a direct control of the process chambers or alternatively, by controlling the computers (or controllers) associated with the process chambers and the process chamber 902. In operation, the controller 998 enables data collection and feedback from the respective chambers and systems to optimize performance of the process chamber 902. The controller 998 generally includes a Central Processing Unit (CPU) 960, a memory 958, and a support circuit 962. The CPU 960 may be any form of a general-purpose computer processor that can be used in an industrial setting. The support circuit 962 is conventionally coupled to the CPU 960 and may comprise a cache, clock circuits, input/output subsystems, power supplies, and the like. Software routines, such as a method as described above may be stored in the memory 958 and, when executed by the CPU 960, transform the CPU 960 into a specific purpose computer (controller 998). The software routines may also be stored and/or executed by a second controller (not shown) that is located remotely from the process chamber 902.

The memory 958 is in the form of computer-readable storage media that contains instructions, when executed by the CPU 960, to facilitate the operation of the semiconductor processes and equipment. The instructions in the memory 958 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 7:
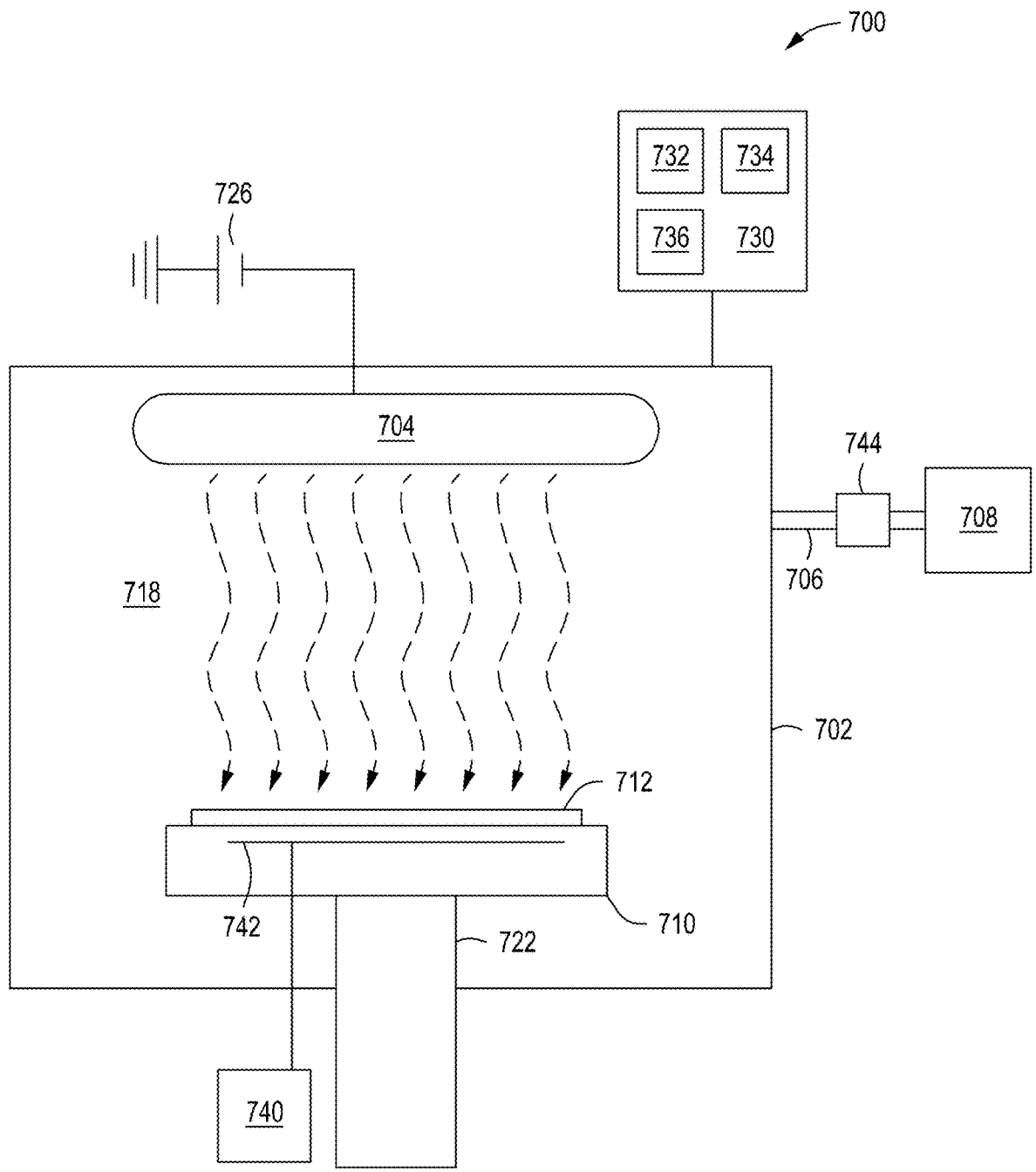
FIG. 7 depicts a thermal oxidation process chamber in accordance with some embodiments of the present principles.

FIG. 7 depicts a view 700 of a process chamber 702 used for thermal oxidation treatments in accordance with some embodiments. The process chamber 702 may be used as one source for oxidizing the metal fill material deposited in a feature. The process chamber 702 incorporates ultraviolet (UV) techniques for thermally processing the substrate 712. Power supply 726 for the generation of the UV waves may be directly applied to a UV source 704 or applied to microwave source (not shown) and the like which is then used to generate the UV waves of the UV source 704 in the processing volume 718. The process chamber 702 includes a substrate support 722 that holds a substrate 712 on a pedestal 710 for processing. A process gas or gases may be provided into the processing volume 718 via a supply conduit 706 from a gas supply 708. The process gas flow rate is controlled by a gas flow valve 744. In some embodiments, the process gas is oxygen. In some embodiments, the process gas is ozone. The process chamber 702 may also have cooling and/or heating elements or channels 742 that allow temperature control of the substrate 712 during processing by a temperature controller 740. In some embodiments, the process temperature may be approximately 200 degrees Celsius to approximately 500 degrees Celsius. In some embodiments, the process temperature may be approximately 485 degrees Celsius for single cycle processes. In some embodiments, the process temperature may be approximately 385 degrees Celsius for multiple cycle processes.

A controller 730 controls the operation of the process chamber 702 using a direct control of the process chamber 702 or alternatively, by controlling the computers (or controllers) associated with the process chamber 702. In operation, the controller 730 enables data collection and feedback from the respective systems to optimize performance of the process chamber 702. The controller 730 generally includes a Central Processing Unit (CPU) 732, a memory 734, and a support circuit 736. The CPU 732 may be any form of a general-purpose computer processor that can be used in an industrial setting. The support circuit 736 is conventionally coupled to the CPU 732 and may comprise a cache, clock circuits, input/output subsystems, power supplies, and the like. Software routines, such as a method as described herein may be stored in the memory 734 and, when executed by the CPU 732, transform the CPU 732 into a specific purpose computer (controller 730). The software routines may also be stored and/or executed by a second controller (not shown) that is located remotely from the process chamber 702.

The memory 734 is in the form of computer-readable storage media that contains instructions, when executed by the CPU 732, to facilitate the operation of the semiconductor processes and equipment. The instructions in the memory 734 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 8:
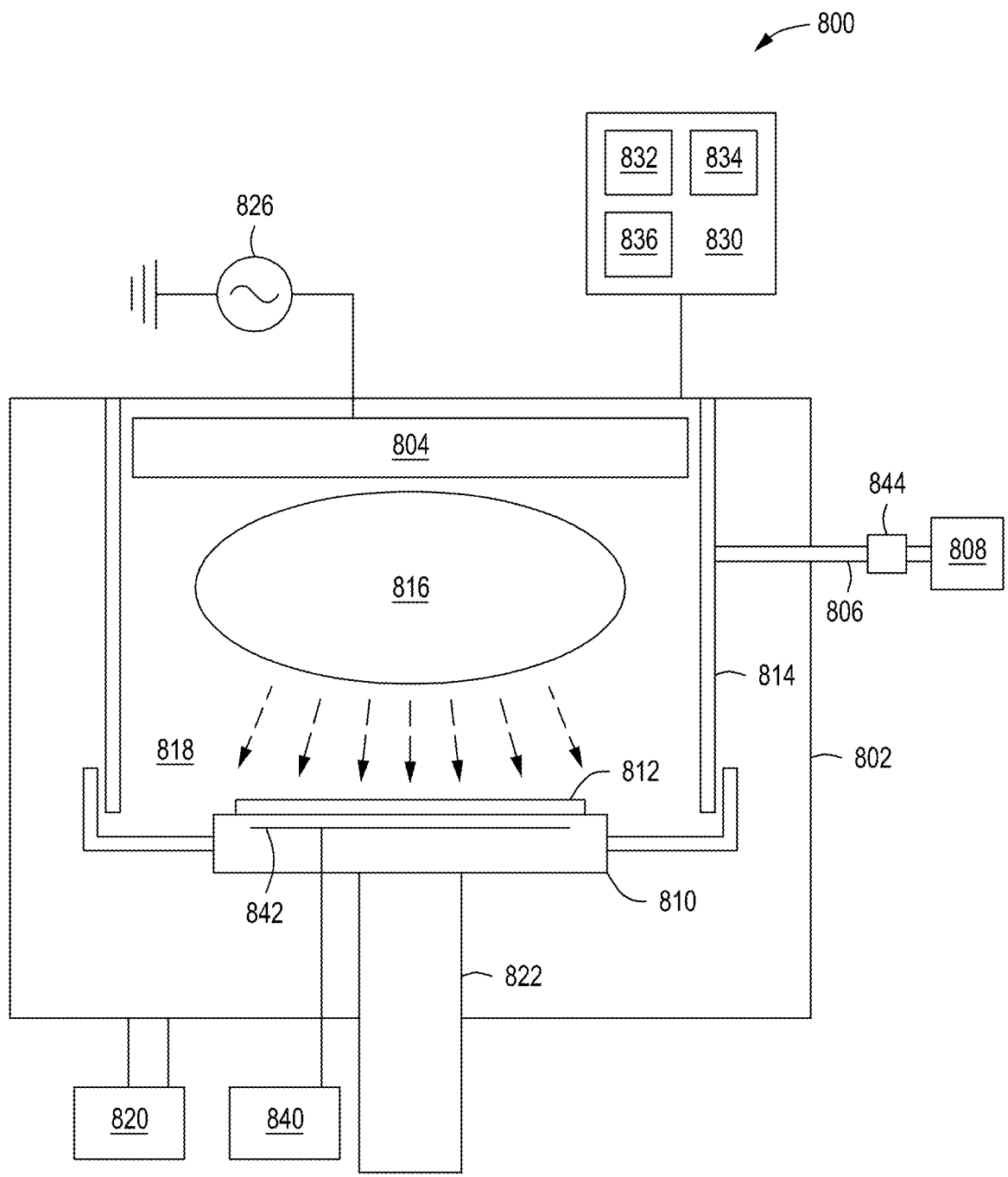
FIG. 8 depicts a plasma-assisted oxidation or nitridation process chamber in accordance with some embodiments of the present principles.

FIG. 8 depicts a view 800 of a process chamber 802 used for plasma-assisted oxidation processes in accordance with some embodiments. The process chamber 802 may be used as one source for oxidizing the metal fill material deposited in a feature. The process chamber 802 incorporates plasma techniques for oxidizing the metal material on the substrate 812. The electrode 804 can be used as an inductively coupled plasma or capacitively coupled plasma source. A power source 826 provides power to the electrode 804 to generate plasma 816 in the process chamber 802. The process chamber 802 includes a substrate support 822 that holds an electrostatic chuck (ESC) 810 and a shield 814 that surrounds a processing volume 818. A process gas or gases may be provided into the processing volume 818 via a supply conduit 806 from a gas supply 808. The process gas flow rate is controlled by a gas flow valve 844. In some embodiments, the process gas is an oxygen-based gas. The process chamber 802 can be a capacitively coupled plasma chamber or an inductively coupled plasma chamber that forms plasma 816 in the processing volume 818 to process a substrate 812 on the ESC 810. The plasma reactions produce oxygen that is used to penetrate the metal material of the seamless gap fill to convert the metal material into high-k dielectric material.

As the plasma and oxygen ions interact with the substrate 812, contaminants may be formed which are removed from the process chamber 802 by a pump 820. The pump 820 may also be used to maintain the process pressure within the process chamber 802. The process chamber 802 may also have cooling and/or heating elements or channels 842 that allow temperature control of the substrate 812 during processing by a temperature controller 840. In some embodiments, the process temperature may be approximately 200 degrees Celsius to approximately 500 degrees Celsius. In some embodiments, the process temperature may be approximately 485 degrees Celsius for single cycle processes. In some embodiments, the process temperature may be approximately 385 degrees Celsius for multiple cycle processes.

A controller 830 controls the operation of the process chamber 802 using a direct control of the process chamber 802 or alternatively, by controlling the computers (or controllers) associated with the process chamber 802. In operation, the controller 830 enables data collection and feedback from the respective systems to optimize performance of the process chamber 802. The controller 830 generally includes a Central Processing Unit (CPU) 832, a memory 834, and a support circuit 836. The CPU 832 may be any form of a general-purpose computer processor that can be used in an industrial setting. The support circuit 836 is conventionally coupled to the CPU 832 and may comprise a cache, clock circuits, input/output subsystems, power supplies, and the like. Software routines, such as a method as described herein may be stored in the memory 834 and, when executed by the CPU 832, transform the CPU 832 into a specific purpose computer (controller 830). The software routines may also be stored and/or executed by a second controller (not shown) that is located remotely from the process chamber 802.

The memory 834 is in the form of computer-readable storage media that contains instructions, when executed by the CPU 832, to facilitate the operation of the semiconductor processes and equipment. The instructions in the memory 834 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Any embodiment in accordance with the present principles disclosed herein may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for dielectric filling of a feature on a substrate, comprising:
depositing a metal material into the feature and direct filling of the feature starting from a bottom of the feature, wherein the feature has an opening ranging from less than to approximately 150 nm at an upper surface of the substrate and wherein depositing the metal material is performed using a high metal ionization physical vapor deposition (PVD) process in a very high frequency RF based PVD chamber or a high ionization DC based PVD chamber to form a seamless metal gap fill; and
treating the seamless metal gap fill by oxidizing the metal material of the seamless metal gap fill with an oxidation process or by nitridizing the metal material with a nitridation process to form dielectric material, wherein the seamless metal gap fill is converted into a seamless dielectric gap fill with high-k dielectric material and wherein treating the seamless metal gap fill has a duration of approximately 200 seconds to approximately 300 seconds for a single cycle treatment at a first temperature and approximately 10 seconds to approximately 100 seconds for each cycle of a multi-cycle treatment at a second temperature lower than the first temperature.

2. The method of claim 1, further comprising:
performing the oxidation process at a temperature of approximately room temperature to approximately 500 degrees Celsius.

3. The method of claim 1, further comprising:
depositing the metal material at a pressure of approximately 50 mTorr to approximately 500 mTorr with the very high frequency RF based PVD chamber or at a pressure of approximately less than 5 mT with the high ionization DC based PVD chamber.

4. The method of claim 1, further comprising:
depositing the metal material with the very high frequency RF based PVD chamber using an RF power frequency of approximately 40 MHz with an RF power of approximately 1000 watts to approximately 7000 watts; or
depositing the metal material with high ionization DC based PVD chamber using a source DC power of approximately 15 kW to approximately 60 kW with an RF bias power of approximately 75 watts to approximately 1500 watts.

5. The method of claim 1, wherein the metal material is hafnium, aluminum, tantalum, or zirconium.

6. The method of claim 1, wherein the oxidation process is a thermal oxidation process or a plasma-assisted oxidation process.

7. The method of claim 6, wherein the thermal oxidation process is an ultraviolet (UV) plus ozone-based process or a UV plus oxygen-based process.

8. The method of claim 7, further comprising:
performing the UV plus ozone-based process for approximately 200 seconds to approximately 300 seconds.

9. The method of claim 8, further comprising:
performing the UV plus ozone-based process for approximately 240 seconds at a temperature of 485 degrees Celsius.

10. The method of claim 6, wherein the plasma-assisted oxidation process is an inductively coupled plasma (ICP) oxygen plasma discharge-based oxidation process with a first process temperature or a capacitively coupled plasma (CCP) oxygen plasma discharge-based oxidation process with a second process temperature that is different from the first process temperature.

11. The method of claim 10, further comprising:
performing the plasma-assisted oxidation process at a pressure of approximately 1 mTorr to approximately 30 mTorr and a power range from approximately 50 W to approximately 1000 W.

12. The method of claim 1, further comprising:
depositing the metal material with high ionization DC based PVD chamber with a collimator and using a source DC power of approximately 15 kW to approximately 60 kW with an RF bias power of approximately 75 watts to approximately 1500 watts and a DC pulsed bias power applied to the collimator.

13. The method of claim 1, further comprising:
repeating the method for at least two cycles until the feature is filled from the bottom to approximately the upper surface of the substrate or beyond.

14. A method for dielectric filling of a feature on a substrate, comprising:
depositing a metal material into the feature and direct filling of the feature starting from a bottom of the feature, wherein the feature has an opening ranging from less than to approximately 150 nm at an upper surface of the substrate and wherein depositing the metal material is performed using a high metal ionization physical vapor deposition (PVD) process to form a seamless metal gap fill in a very high frequency RF based PVD chamber using an RF power frequency of approximately 40 MHz with an RF power of approximately 1000 watts to approximately 7000 watts at a pressure of approximately 50 mTorr to approximately 500 mTorr or a high ionization DC based PVD chamber using a source DC power of approximately to approximately 60 kW with an RF bias power of approximately 75 watts to approximately 1500 watts at a pressure of approximately less than 5 mTorr; and
treating the seamless metal gap fill by oxidizing the metal material of the seamless metal gap fill with an oxidation process or by nitridizing the metal material with a nitridation process to form dielectric material, wherein the seamless metal gap fill is converted into a seamless dielectric gap fill with high-k dielectric material and wherein treating the seamless metal gap fill has a duration of approximately 200 seconds to approximately 300 seconds for a single cycle treatment at a first temperature and approximately 10 seconds to approximately 100 seconds for each cycle of a multi-cycle treatment at a second temperature lower than the first temperature.

15. The method of claim 14, wherein the oxidation process is a thermal oxidation process or a plasma-assisted oxidation process.

16. The method of claim 15, wherein the thermal oxidation process is an ultraviolet (UV) plus ozone-based process or a UV plus oxygen-based process.

17. The method of claim 16, further comprising:
performing the UV plus ozone-based process for approximately 200 seconds to approximately 300 seconds.

18. The method of claim 17, further comprising:
performing the UV plus ozone-based process for approximately 240 seconds at a temperature of 485 degrees Celsius.

19. The method of claim 15, further comprising:
performing the plasma-assisted oxidation process at a pressure of approximately 1 mTorr to approximately 30 mTorr and a power range of approximately 50 W to approximately 1000 W.

20. A non-transitory, computer readable medium having instructions stored thereon that, when executed, cause a method for dielectric filling of a feature on a substrate to be performed, the method comprising:
depositing a metal material into the feature and direct filling of the feature starting from a bottom of the feature, wherein the feature has an opening of less than 20 nm to approximately 150 nm at an upper surface of the substrate and wherein depositing the metal material is performed using a high metal ionization physical vapor deposition (PVD) process in a very high frequency RF based PVD chamber or a high ionization DC based PVD chamber to form a seamless metal gap fill; and
treating the seamless metal gap fill by oxidizing the metal material of the seamless metal gap fill with an oxidizing process to form dielectric material, wherein the seamless metal gap fill is converted into a seamless dielectric gap fill with high-k dielectric material and wherein treating the seamless metal gap fill has a duration of approximately 200 seconds to approximately 300 seconds for a single cycle treatment at a first temperature and approximately 10 seconds to approximately 100 seconds for each cycle of a multi-cycle treatment at a second temperature lower than the first temperature.

* * * * *